(12) United States Patent
Muench et al.

(10) Patent No.: US 8,237,513 B2
(45) Date of Patent: Aug. 7, 2012

(54) PHASE LOCKED LOOP WITH STARTUP OSCILLATOR AND PRIMARY OSCILLATOR

(75) Inventors: Paul D. Muench, Poughkeepsie, NY (US); Mangal Prasad, Poughkeepsie, NY (US); George E. Smith, III, Wappingers Falls, NY (US); Michael A. Sperling, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 83 days.

(21) Appl. No.: 12/821,526

(22) Filed: Jun. 23, 2010

(65) Prior Publication Data

US 2011/0316593 A1    Dec. 29, 2011

(51) Int. Cl.
*H03L 7/099*    (2006.01)
*H03K 3/03*    (2006.01)

(52) U.S. Cl. .................................. 331/2; 331/49; 331/57
(58) Field of Classification Search ..................... 331/57, 331/46, 49, 55, 172, 173, 2
See application file for complete search history.

(56) References Cited

U.S. PATENT DOCUMENTS

| | | | |
|---|---|---|---|
| 5,389,898 A * | 2/1995 | Taketoshi et al. ................. | 331/2 |
| 5,864,572 A | 1/1999 | Bhagwan | |
| 6,020,781 A * | 2/2000 | Fujioka ......................... | 327/541 |
| 6,140,880 A | 10/2000 | Moyal et al. | |
| 6,177,843 B1 | 1/2001 | Chou et al. | |
| 6,369,660 B1 | 4/2002 | Wei et al. | |
| 6,747,519 B2 * | 6/2004 | Jaehne et al. ................... | 331/16 |
| 6,781,470 B2 * | 8/2004 | Rogerson ........................ | 331/57 |
| 6,853,254 B2 | 2/2005 | Li | |
| 7,391,275 B2 | 6/2008 | Jordy | |
| 7,791,420 B2 * | 9/2010 | Chen et al. ...................... | 331/57 |
| 2008/0036543 A1 | 2/2008 | Bazes | |

\* cited by examiner

*Primary Examiner* — Ryan Johnson
(74) *Attorney, Agent, or Firm* — Cantor Colburn LLP; William A. Kinnaman, Jr.

(57) ABSTRACT

A voltage controlled oscillator (VCO) for a phase locked loop (PLL) includes a startup oscillator, the startup oscillator comprising a first plurality of inverters; a primary oscillator, the primary oscillator comprising a second plurality of inverters, wherein a number of the second plurality of inverters is fewer than the number of the first plurality of inverters; and a control module connected to the startup oscillator and the primary oscillator. A method of operating a voltage controlled oscillator (VCO) in a phase locked loop (PLL), the VCO comprising a startup oscillator and a primary oscillator includes sending an enable signal to the startup oscillator; waiting a predetermined number of startup oscillator clock cycles; and when the predetermined number of startup oscillator clock cycles has elapsed, sending a disable signal to the startup oscillator, and sending an enable signal to the primary oscillator.

14 Claims, 3 Drawing Sheets

PHASE LOCKED LOOP WITH STARTUP OSCILLATOR AND PRIMARY OSCILLATOR

BACKGROUND

This invention relates generally to phase locked loops, and more specifically to prevention of runaway in a phase locked loop.

A phase-locked loop (PLL) is a closed-loop feedback control system that generates and outputs a signal in relation to the frequency and phase of an input signal. The PLL responds to both the frequency and the phase of the input signal and automatically raises or lowers the frequency of a controlled oscillator until it matches the input signal in both frequency and phase.

FIG. 1 illustrates a block diagram of a PLL 100. The PLL 100 comprises a phase-frequency indicator (PFD) 102, a charge pump 105, a loop filter 107, a voltage controller oscillator (VCO) 109, and a divider 111. The PFD 102 receives an input clock signal 101 from an input clock (not shown) and a feedback signal 112 from divider 111. The PFD 103 will either output an UP signal 103 or a DOWN signal 104 to the charge pump 105 based on the difference in frequency between input clock signal 101 and feedback signal 112. Based on the UP 103 or DOWN 104 signal provided to charge pump 105, the charge pump 105 outputs a charge pump voltage 106 to the loop filter 107. The loop filter 107 filters the charge pump voltage 106 to eliminate any noise or distortion before passing control voltage 108 to the VCO 109. Based on the control voltage 108, the VCO 109 may increase or decrease the frequency of the VCO's output signal, and output that frequency at PLL output 110.

The PLL 100 may operate in a steady-state (locked) or transient (unlocked) condition. When the PLL is in steady-state operation, the PLL output 110 from VCO 109 has a frequency that is N times higher than the frequency of the input clock signal 101 received by the PFD. The multiple N is the divisor used by divider 111. Thus, in lock, the feedback signal 112 input to the PFD 102 should have about the same frequency as the input clock signal 101; minor adjustments may be made using UP signal 103 and DOWN signal 104 accordingly.

Generally, the PLL 100 may operate in the transient state when the PLL 100 is powering up and acquiring lock. The PLL 100 also may operate in transient state if a disturbance, such as a supply glitch or other noise, causes the PLL 100 to lose lock. In transient state, the PLL output 110 may have any value, either above or below the frequency of the input clock signal 101. To attempt to bring the PLL 100 into the locked state, the PLL 100 may adjust the operation of the VCO 109 in a direction that will bring the PLL into lock.

The VCO 109 may not start at a low frequency because the control voltage 108 is initialized to a low value, which may be below the oscillator threshold of the VCO 109. When the PLL 100 starts, the control voltage 108 is ramped up past the oscillator threshold, and a noise event is relied upon to start the VCO 109. However, if the VCO 109 has low loop gain, it may not receive a noise event sufficient to start the VCO 109 in time, causing the control voltage 108 to ramp all the way to the power rail before the PFD 102 receives a feedback signal 112. If the noise event that starts VCO 109 occurs after the control voltage 108 ramps up to the power rail, the VCO 109 starts out running as fast as it can, and the PLL 100 may be in a runaway state. Runaway occurs when the frequency of the signal at PLL output 110 from VCO 109 is so high that the divider 111 fails to respond to it correctly, causing the PLL 100 to malfunction. Divider 111 may output a feedback signal 112 that is either a corrupted signal or no signal at all. In this situation, the PFD 102 may see signal transitions in input clock signal 101, but few or not transitions in feedback signal 112 from divider 111. The PFD 102 may mistakenly interpret this situation to be one in which the frequency at PLL output 110 is too low instead of too high. Consequently, instead of activating DOWN signal 104 to charge pump 105 to decrease the frequency of VCO 109, the PFD may actually activate the UP signal 103 to the charge pump 105, causing the frequency of VCO 109 to increase further until it plateaus at the maximum possible operating frequency.

SUMMARY

An embodiment is a voltage controlled oscillator (VCO) for a phase locked loop (PLL) including a startup oscillator, the startup oscillator comprising a first plurality of inverters; a primary oscillator, the primary oscillator comprising a second plurality of inverters, wherein a number of the second plurality of inverters is fewer than the number of the first plurality of inverters; and a control module connected to the startup oscillator and the primary oscillator.

Another exemplary embodiment is a method of operating a voltage controlled oscillator (VCO) in a phase locked loop (PLL), the VCO comprising a startup oscillator and a primary oscillator includes sending an enable signal to the startup oscillator; waiting a predetermined number of startup oscillator clock cycles; and when the predetermined number of startup oscillator clock cycles has elapsed, sending a disable signal to the startup oscillator, and an enable signal to the primary oscillator.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

An exemplary embodiment of the present invention provides a phase locked loop (PLL) with a voltage controlled oscillator (VCO) comprising a startup oscillator and a primary oscillator. Technical effects and benefits include prevention of runaway conditions in the PLL. PLL runaway may be corrected by detecting when a runaway occurs and then taking remediative corrective action. Corrective action may take the form of directly adjusting the UP signal 103, DOWN signal 104, charge pump voltage 106, or control voltage 108, or may include resetting the entire PLL 100. However, none of these types of action prevent a runaway from occurring in the first place. Additionally, complex circuitry may need to be added to critical nodes inside the PLL 100 to detect and correct the runaway, which may slow the PLL down, consume extra power, and cause additional noise in the PLL. Therefore, it is desirable to have a VCO configuration that prevents the occurrence of a runaway in a PLL.

Figure 1:
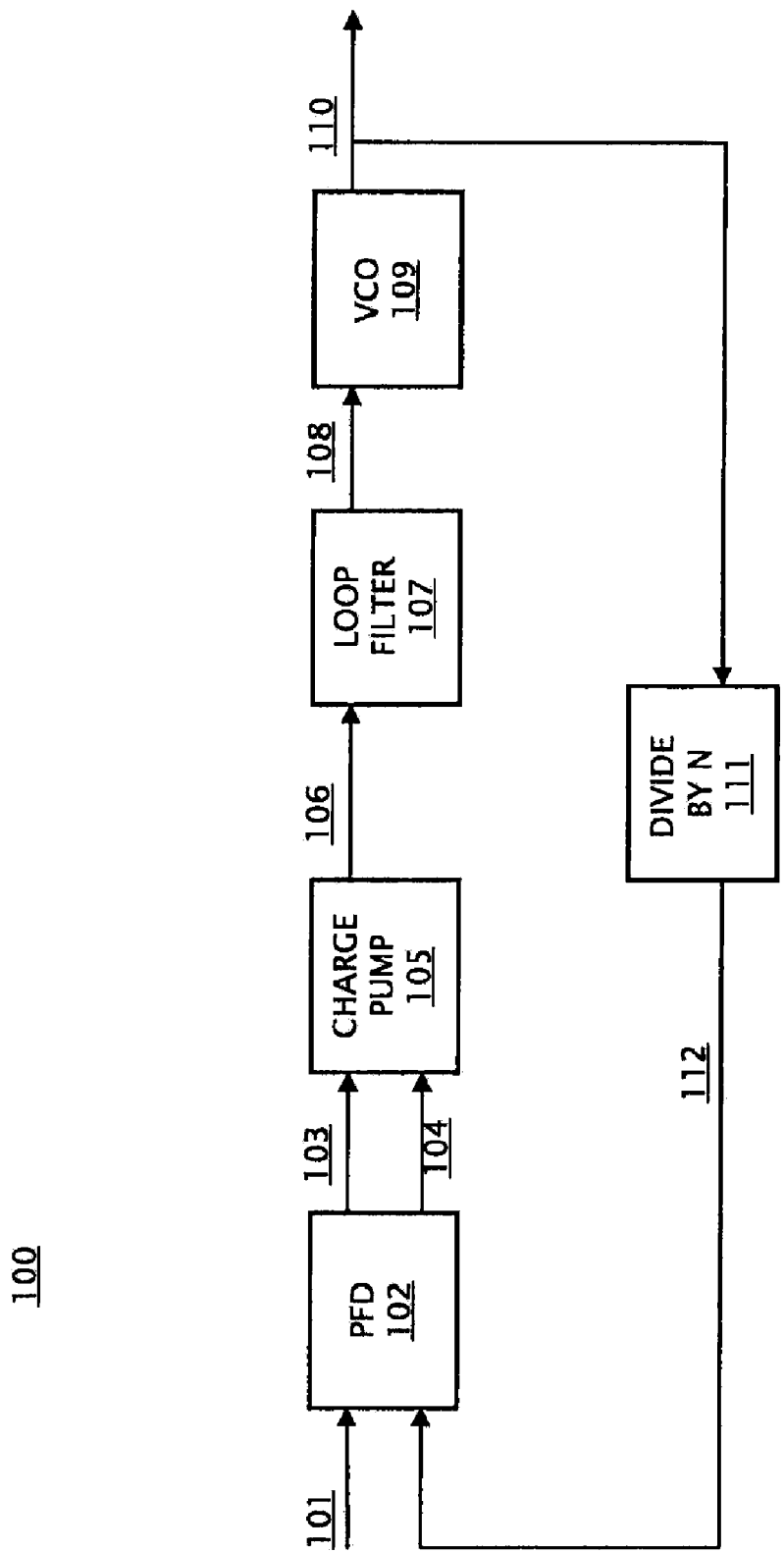
FIG. 1 depicts an embodiment of a phase locked loop with a voltage controlled oscillator.

The startup oscillator and the primary oscillator each contain an odd number of inverter delay stages; these delay stages provide the oscillation that determine the frequency of the signal output at VCO/PLL output 110 of FIG. 1. The startup oscillator contains an even number of additional delay stages as compared to the primary oscillator, causing the startup oscillator to be slower than the primary oscillator. Because of the additional delay stages, the startup oscillator also has more loop gain and a lower oscillator threshold than the primary oscillator, so a relatively low control voltage 108 causes the startup oscillator to start up and output a signal having a relatively low frequency. Therefore, when the PLL turns on, the startup oscillator is enabled and turns on. There is then a wait of a predetermined number of clock cycles of the startup oscillator. After expiration of the predetermined number of startup oscillator clock cycles, the startup oscillator is disabled, and the faster primary oscillator is enabled. The control voltage 108 is above the startup threshold for the primary oscillator and below the power rail voltage at this point, so the primary oscillator turns on and outputs an appropriate frequency, thereby preventing runaway.

Figure 2:
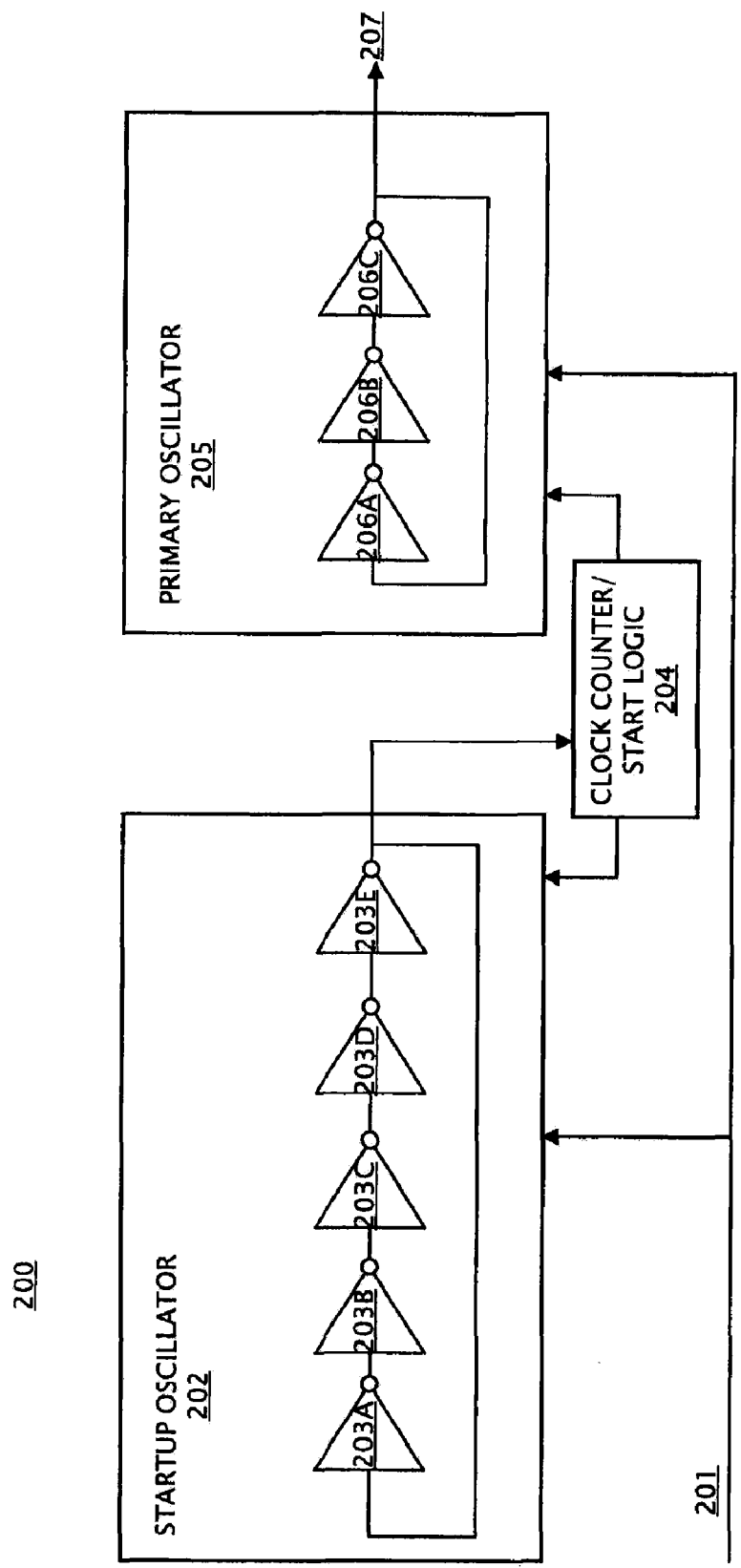
FIG. 2 depicts an embodiment of a voltage controlled oscillator with a startup oscillator and a primary oscillator.

FIG. 2 illustrates an embodiment of a VCO 200 with a startup oscillator 202 and a primary oscillator 205. FIG. 2 is discussed with reference to FIG. 1; VCO 200 may comprise the VCO 109 of FIG. 1. Input 201 receives control voltage 108 from loop filter 107 of FIG. 1. Input 201 is connected to both startup oscillator 202 and primary oscillator 205. The startup oscillator 202 and primary oscillator 205 each output a signal having a frequency that is based on the control voltage from input 201 during operation. Startup oscillator 202 outputs a signal to clock counter/start logic module 204. Primary oscillator 205 outputs a signal on VCO output 207, which is connected to VCO/PLL output 110 of FIG. 1. Clock counter/start logic module 204 controls startup oscillator 202 and primary oscillator 205. As shown in FIG. 2, startup oscillator 202 includes 5 inverters 203A-E connected in series, and primary oscillator 205 includes 3 inverters 205A-C connected in series. However, inverters 203A-E and inverters 205A-C of FIG. 2 are shown for illustrative purposes only; startup oscillator 202 and primary oscillator 205 may each comprise any appropriate number of inverters connected in series, so long as the respective number of inverters in each of startup oscillator 202 and primary oscillator 205 is odd, and startup oscillator 202 comprises an even number of additional oscillators as compared to primary oscillator 205. In some embodiments, the number of inverters in startup oscillator 202 may be about 50% more than a number of inverters in primary oscillator 205. The output of startup oscillator 202 has a lower frequency and a higher loop gain than the output of primary oscillator 205 for the same input signal. Startup oscillator 202 also has a lower oscillator threshold than primary oscillator 205, due to the higher loop gain of startup oscillator 202.

Figure 3:
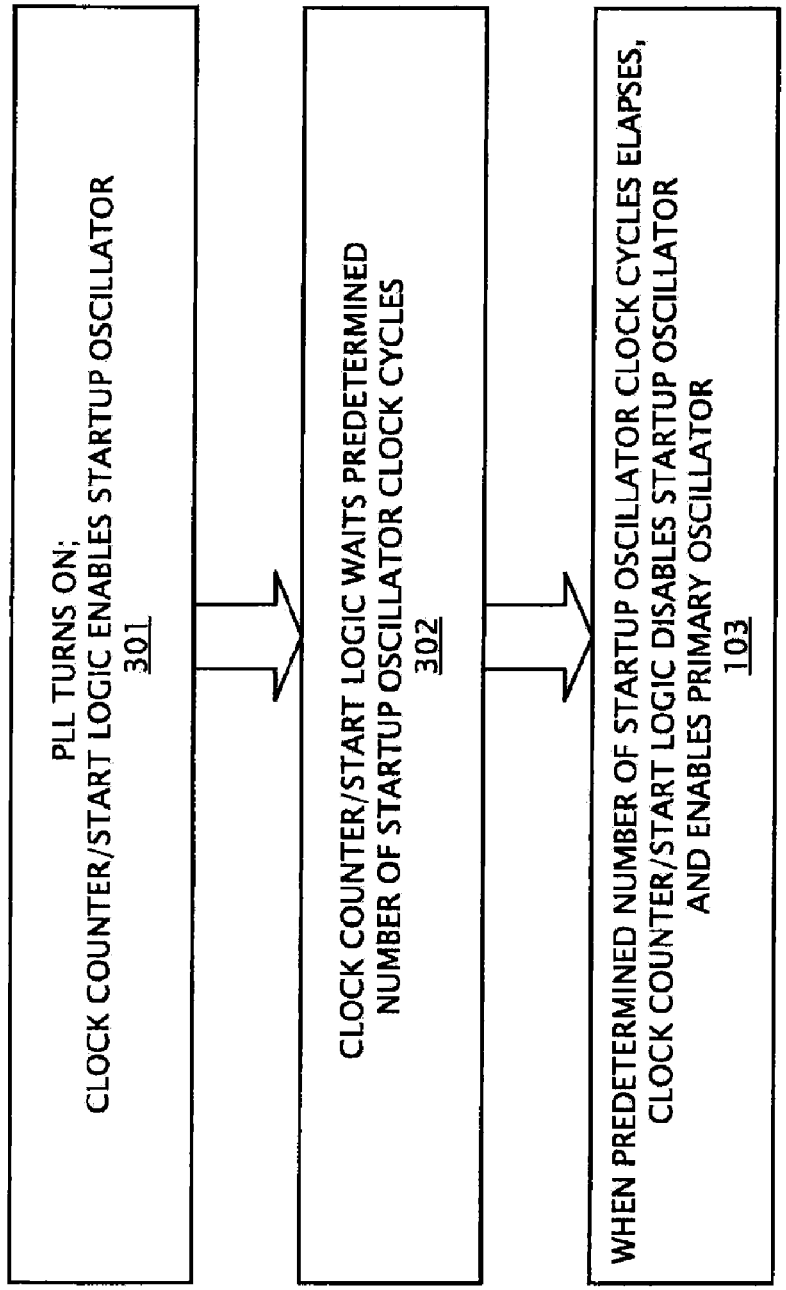
FIG. 3 depicts an embodiment of a method of operating a voltage controlled oscillator with a startup oscillator and a primary oscillator.

FIG. 3 illustrates a method 300 of operating a VCO 200 with a startup oscillator 202 and a primary oscillator 205; FIG. 3 is discussed with respect to FIGS. 1 and 2. Method 300 may be implemented in clock counter/start logic module 204. In block 301, the PLL 100 is turned on, and clock counter/start logic module 204 sends an enable signal to startup oscillator 202. In block 302, the voltage from input 201 passes the oscillator threshold of startup oscillator 202, so that startup oscillator 202 starts up and outputs a signal to clock counter/start logic 204 having a frequency based on the control voltage 108 received on input 201. Because startup oscillator 202 has a relatively high gain and relatively low oscillator threshold, startup oscillator 202 starts at a relatively low input voltage from input 201, and outputs a signal having a relatively low frequency. Clock counter/start logic module 204 waits for a predetermined number of startup oscillator clock cycles to elapse. The predetermined number of startup oscillator cycles may be selected so as to ensure that the control voltage 108 from input 201 is sufficiently high to start up primary oscillator 205 while avoiding a runaway condition. Then, in block 303, when the predetermined number of clock cycles has elapsed, clock counter/start logic module 204 sends a disable signal to startup oscillator 202, and an enable signal to primary oscillator 205. The voltage from input 201 is now over the oscillator threshold of primary oscillator 205, so that the primary oscillator 205 starts up and outputs on output 207 a signal having a frequency based on the voltage received on input 201. PLL 100 outputs the signal generated by primary oscillator 205 on output 207 as VCO/PLL output 110.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The invention claimed is:

1. A voltage controlled oscillator (VCO) for a phase locked loop (PLL), comprising:
    a startup oscillator;
    a primary oscillator wherein the startup oscillator has a lower frequency than the primary oscillator, and wherein the startup oscillator and the primary oscillator are each controlled by a control voltage; and
    a control module connected to the startup oscillator and the primary oscillator, wherein the control module comprises a clock counter, and further comprises a start logic module configured to:
        send a startup enable signal to the startup oscillator at startup of the PLL, wherein the control voltage is below an oscillator threshold of the startup oscillator and the startup oscillator and primary oscillators are each turned off at startup of the PLL, wherein the control voltage is configured to increase after startup of the PLL, and wherein the startup oscillator is configured to turn on when the control voltage is greater than the oscillator threshold of the startup oscillator after receiving of the startup enable signal by the startup oscillator;
        wait a predetermined number of clock cycles of the startup oscillator after turning on of the startup oscillator; and
        when the predetermined number of startup oscillator clock cycles has elapsed, wherein elapsing of the predetermined number of startup oscillator clock cycles is determined by the clock counter:
            send a disable signal to the startup oscillator such that the startup oscillator turns off; and
            send a primary enable signal to the primary oscillator such that the primary oscillator is turned on by the control voltage after receiving of the primary enable signal by the primary oscillator.

2. The VCO for a PLL of claim 1, wherein the startup oscillator comprises a first plurality of inverters, the primary oscillator comprises a second plurality of inverters, and wherein a number of the second plurality of inverters is fewer than the number of the first plurality of inverters.

3. The VCO for a PLL of claim 2, wherein the number of the first plurality of inverters is odd, the number of the second plurality of inverters is odd, and wherein a difference between the number of the first plurality of inverters and the number of the second plurality of inverters is even.

4. The VCO for a PLL of claim 1, wherein an output of the startup oscillator output is connected to the clock counter, and wherein an output of the primary oscillator is connected to an output of the VCO.

5. The VCO for a PLL of claim 4, wherein the output of the startup oscillator is not connected to the output of the VCO.

6. The VCO for a PLL of claim 1, wherein the primary oscillator has an oscillator threshold that is higher than the oscillator threshold of the startup oscillator.

7. The VCO for a PLL of claim 1, wherein the predetermined number of clock cycles of the startup oscillator is selected such that the control voltage is lower than a power rail voltage, the power rail voltage comprising a maximum voltage of the control voltage, when the primary oscillator is turned on.

8. A method of operating a voltage controlled oscillator (VCO) in a phase locked loop (PLL), the VCO comprising a startup oscillator and a primary oscillator each controlled by a control voltage, the method comprising:
sending a startup enable signal to the startup oscillator at startup of the PLL, wherein the startup oscillator has a lower frequency than the primary oscillator, and wherein the control voltage is below an oscillator threshold of the startup oscillator and the startup and primary oscillators are turned off at startup of the PLL;
increasing the control voltage;
turning on the startup oscillator when the control voltage is greater than the oscillator threshold of the startup oscillator;
waiting a predetermined number of clock cycles of the startup oscillator after turning on of the startup oscillator; and
when the predetermined number of startup oscillator clock cycles has elapsed:
sending a disable signal to the startup oscillator such that the startup oscillator turns off after receiving the disable signal; and
sending a primary enable signal to the primary oscillator such that the primary oscillator is turned on by the control voltage after receiving the primary enable signal.

9. The method of claim 8, wherein the startup oscillator comprises a first plurality of inverters, the primary oscillator comprises a second plurality of inverters, and wherein a number of the second plurality of inverters is fewer than the number of the first plurality of inverters.

10. The method of claim 9, wherein the number of the first plurality of inverters is odd, the number of the second plurality of inverters is odd, and wherein a difference between the number of the first plurality of inverters and the number of the second plurality of inverters is even.

11. The method of claim 8, wherein an output of the startup oscillator output is connected to a clock counter configured to determine the elapsing of the predetermined number of startup oscillator clock cycles, and wherein an output of the primary oscillator is connected to an output of the VCO.

12. The method of claim 11, wherein the output of the startup oscillator is not connected to the output of the VCO.

13. The method of claim 8, wherein the primary oscillator has an oscillator threshold that is higher than the oscillator threshold of the startup oscillator.

14. The method of claim 8, wherein the predetermined number of clock cycles of the startup oscillator is selected such that the control voltage is lower than a power rail voltage, the power rail voltage comprising a maximum voltage of the control voltage, when the primary oscillator is turned on.

* * * * *